(12) United States Patent
Ciccarelli et al.

(10) Patent No.: US 8,521,198 B2
(45) Date of Patent: Aug. 27, 2013

(54) DYNAMIC LNA SWITCH POINTS BASED ON CHANNEL CONDITIONS

(75) Inventors: Steven C. Ciccarelli, Ramona, CA (US); Brian George, San Diego, CA (US); Soon-Seng Lau, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 838 days.

(21) Appl. No.: 11/560,790

(22) Filed: Nov. 16, 2006

(65) Prior Publication Data

US 2007/0262817 A1 Nov. 15, 2007

Related U.S. Application Data

(60) Provisional application No. 60/799,882, filed on May 12, 2006, provisional application No. 60/813,500, filed on Jun. 13, 2006.

(51) Int. Cl.
*H04B 15/00* (2006.01)

(52) U.S. Cl.
USPC ...... 455/501; 455/214; 455/240.1; 455/245.1

(58) Field of Classification Search
USPC ........................................ 455/501
See application file for complete search history.

(56) References Cited

U.S. PATENT DOCUMENTS

| | | | |
|---|---|---|---|
| 4,455,681 A | 6/1984 | Wile | |
| 5,339,454 A | 8/1994 | Kuo et al. | |
| 5,361,072 A | 11/1994 | Barrick et al. | |
| 5,722,060 A | 2/1998 | Horigome | |
| 5,722,061 A | 2/1998 | Hutchison, IV et al. | |
| 5,930,692 A * | 7/1999 | Peterzell et al. | 455/217 |
| 6,134,430 A | 10/2000 | Younis et al. | |
| 6,175,279 B1 | 1/2001 | Ciccarelli et al. | |

(Continued)

FOREIGN PATENT DOCUMENTS

| | | |
|---|---|---|
| EP | 1503508 | 2/2005 |
| JP | 8307288 A | 11/1996 |

(Continued)

OTHER PUBLICATIONS

International Search Report—PCT/US07/068714—International Search Authority—European Patent Office—Nov. 5, 2007.

(Continued)

*Primary Examiner* — Ajibola Akinyemi
(74) *Attorney, Agent, or Firm* — Ramin Mobarhan

(57) ABSTRACT

Techniques for operating a receiver to linearity performance and higher receive signal to noise ratio are described. The receiver includes one or more circuit blocks, e.g., a low noise amplifier (LNA), having discrete gain states. The gain states are selected based on switch points, with each switch point indicating a specific received signal level at which to switch from one gain state to another gain state. The switch points may be dynamically selected based on channel conditions, which may be characterized by the presence or absence or strength or frequency of jammers. A first set of switch points may be selected when jammers are detected, and a second set of switch points may be selected when jammers are not detected. The gain states are selected in accordance with the set of switch points selected for use.

29 Claims, 7 Drawing Sheets

(56) References Cited

U.S. PATENT DOCUMENTS

| | | |
|---|---|---|
| 6,498,926 B1 * | 12/2002 | Ciccarelli et al. .......... 455/240.1 |
| 6,766,156 B1 | 7/2004 | Hayashihara |
| 7,130,602 B2 | 10/2006 | Ciccarelli |
| 2002/0132597 A1 | 9/2002 | Peterzell et al. |
| 2004/0014450 A1 | 1/2004 | Yamamoto et al. |
| 2004/0142670 A1 * | 7/2004 | Ciccarelli .................... 455/214 |
| 2004/0239559 A1 * | 12/2004 | King et al. ............... 342/357.12 |
| 2007/0243842 A1 * | 10/2007 | Wallace et al. ............ 455/232.1 |

FOREIGN PATENT DOCUMENTS

| | | |
|---|---|---|
| JP | 11274968 A | 10/1999 |
| JP | 2004048581 A | 2/2004 |
| WO | 02056490 | 7/2002 |

OTHER PUBLICATIONS

Written Opinion, PCT/US07/068714, International Search Authority, European Patent Office, Nov. 5, 2007.

* cited by examiner

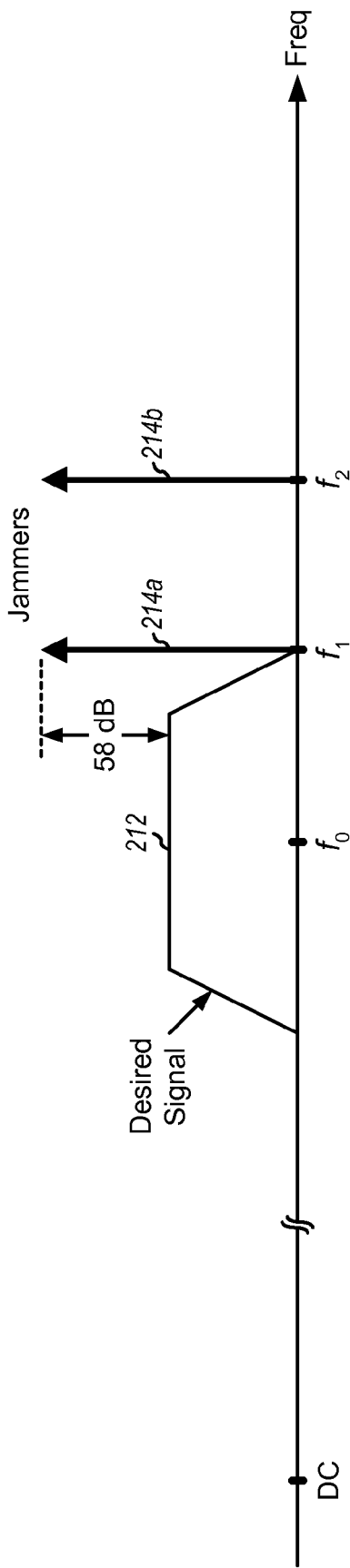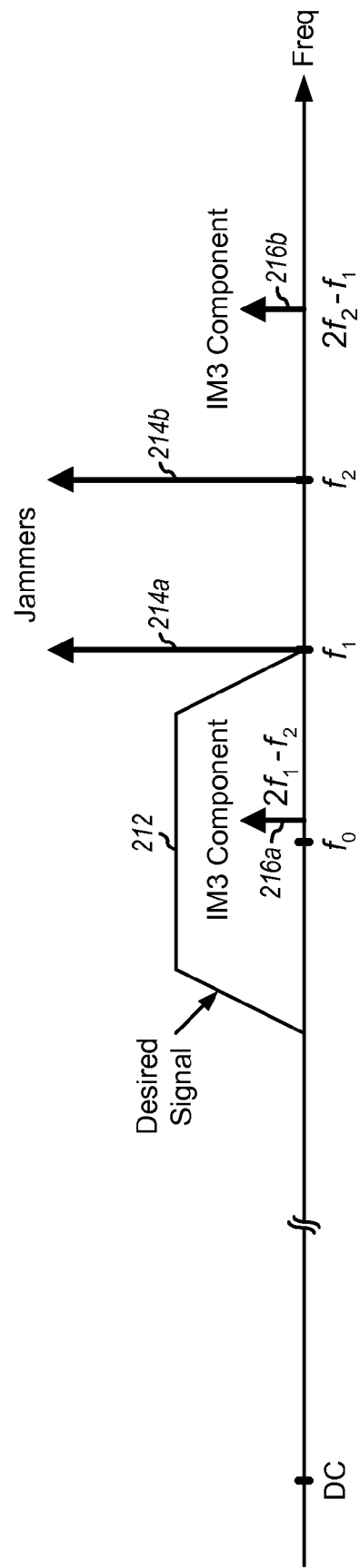
FIG. 2A
FIG. 2B

US 8,521,198 B2

DYNAMIC LNA SWITCH POINTS BASED ON CHANNEL CONDITIONS

The present application claims priority to provisional U.S. Application Ser. No. 60/799,882, entitled "Dynamic LNA Switch Points for Optimally EV-DO Throughput," filed May 12, 2006, and to provisional U.S. Application Ser. No. 60/813,500, entitled "Dynamic LNA Switch Points Based on Channel Conditions," filed Jun. 13, 2006, both of which are assigned to the assignee hereof and incorporated herein by reference.

BACKGROUND

I. Field

The present disclosure relates generally to communication, and more specifically to techniques for operating a receiver in a communication system.

II. Background

The design of a high performance receiver is made challenging by various design considerations. For many applications, high receiver performance is required in order to meet system specifications and/or to achieve good data performance. Receiver performance may be characterized by various parameters such as dynamic range, linearity, and noise performance. Dynamic range refers to the range of received signal level that the receiver is expected to handle. Linearity refers to the ability to amplify a signal without generating a large amount of distortion. Noise performance refers to the amount of noise generated by the receiver.

A receiver is typically designed to meet all applicable system specifications. To support a wide dynamic range, which may be 90 decibels (dB) or more in a Code Division Multiple Access (CDMA) system, the receiver may have multiple discrete gain states, with each gain state providing a particular signal gain and linearity. A suitable gain state may be selected based on the received signal level and channel condition. The points at which to switch gain states may be defined such that the receiver can meet system specifications even with the worst-case operating conditions. The receiver may also be biased with a large amount of current in order to meet linearity requirements with the worst-case jammer conditions. Designing and operating the receiver for the worst-case jammer conditions may result in sub-optimal signal-to-noise ratio performance; and hence, lower data throughput, and higher power consumption in many operating environments.

There is therefore a need in the art for a receiver that can achieve good linearity performance and good signal-to-noise ratio (SNR) performance for better data throughput.

SUMMARY

Techniques for operating a receiver to achieve good linearity performance and higher receive signal to noise ratio (SNR) (I don't think power consumption is the topic of this patent) are described herein. The receiver includes one or more circuit blocks, e.g., a low noise amplifier (LNA), having discrete gain states. The gain states are selected based on switch points, with each switch point indicating a specific received signal level at which to switch from one gain state to another gain state.

In an embodiment, the switch points are dynamically selected based on channel conditions. In this embodiment, the channel conditions observed by the receiver are determined, and the switch points for multiple gain states are selected based on the channel conditions. The gain states are then selected in accordance with the switch points selected for use.

In an embodiment, the channel conditions are characterized by the presence or absence of jammers. A first set of switch points may be selected when jammers are detected, and a second set of switch points may be selected when jammers are not detected. The switch points in the first set may be defined to meet linearity requirements when jammers are present. The switch points in the second set may be defined to achieve higher received signal quality (lower receiver noise figure) when jammers are not present.

Various aspects and embodiments of the invention are described in further detail below.

BRIEF DESCRIPTION OF THE DRAWINGS

Aspects and embodiments of the invention will become more apparent from the detailed description set forth below when taken in conjunction with the drawings in which like reference characters identify correspondingly throughout.

FIGS. 2A and 2B show input and output RF signals for a two-tone test in IS-98D.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
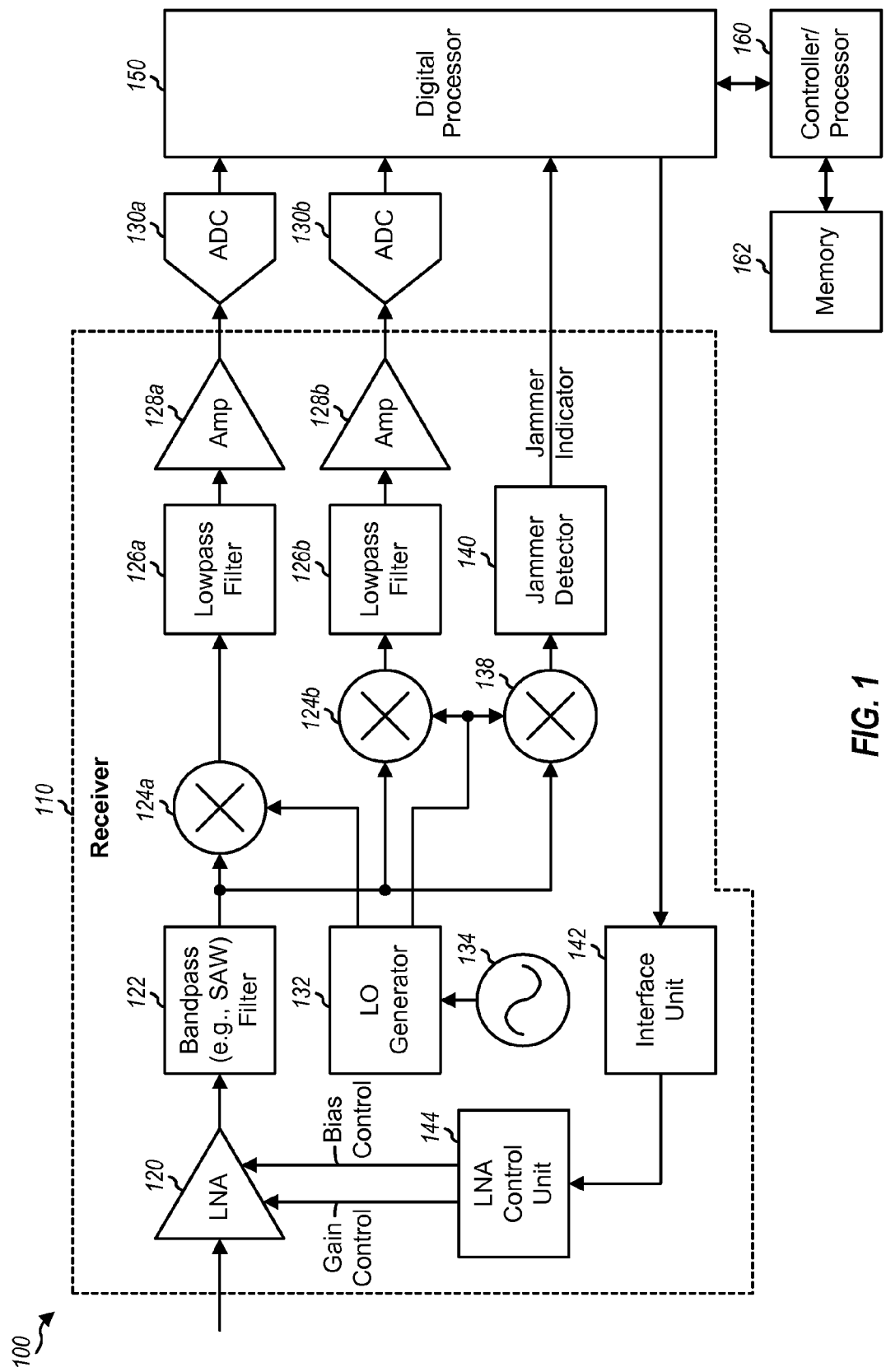
FIG. 1 shows a block diagram of a receiver in a wireless device.

FIG. 1 shows a block diagram of a receiver 110 in a wireless device 100. Wireless device 100 may also be referred to as a mobile station, a user equipment, a user terminal, a subscriber unit, a handset, or some other terminology. Wireless device 100 may be a cellular phone, a personal digital assistant (PDA), a wireless modem, a handheld device, and so on.

Within receiver 110, a low noise amplifier (LNA) 120 amplifies a received radio frequency (RF) signal with a discrete gain and provides an amplified RF signal. In an embodiment, LNA 120 has multiple (M) gain states, with each gain state corresponding to a different gain. One of the M gain states is selected as described below. A bandpass filter 122 filters the amplified RF signal and provides a conditioned RF signal. Bandpass filter 122 passes signal components in a frequency band of interest (e.g., cellular band or PCS band) and removes out-of-band noise and undesired signal components. Bandpass filter 122 may be a surface acoustic wave (SAW) filter or some other type of filter.

In general, a receiver may be implemented with a super-heterodyne architecture or a direct-to-baseband architecture. In the super-heterodyne architecture, the received RF signal is frequency downconverted in multiple stages, e.g., from RF to an intermediate frequency (IF) in one stage, and then from IF to baseband in another stage. In the direct-to-baseband architecture, the received RF signal is frequency downconverted from RF directly to baseband in one stage. The super-heterodyne and direct-to-baseband architectures may use different circuit blocks and/or have different requirements. For clarity, the following description is for the direct-to-baseband architecture.

Mixers 124a and 124b frequency downconvert the conditioned RF signal with inphase (I) and quadrature (Q) local oscillator (LO) signals, respectively, and provide I and Q baseband signals, respectively. An LO signal is a carrier signal at a desired frequency. The I and Q LO signals are 90° out of phase but have the same frequency. An LO generator 132 generates the I and Q LO signals based on a VCO signal from a voltage controlled oscillator (VCO) 134. The frequency of the VCO signal is selected such that the signal component in an RF channel of interest is downconverted to baseband or near baseband.

Lowpass filters 126a and 126b filter the I and Q baseband signals, respectively, to pass the desired signal component in the RF channel of interest and to remove noise and undesired components that may have been generated by the downconversion process. Amplifiers (Amp) 128a and 128b amplify the I and Q filtered baseband signals from lowpass filters 126a and 126b, respectively. Analog-to-digital converters (ADCs) 130a and 130b digitize the I and Q analog signals from amplifiers 128a and 128b, respectively, and provide I and Q data samples to a digital processor 150. Digital processor 150 performs digital signal processing (e.g., demodulation, deinterleaving, decoding, and so on) on the data samples, as specified by the system.

In the embodiment shown in FIG. 1, receiver 110 includes a separate frequency downconversion path for jammer detection. A jammer is an undesired signal component that may be much higher in amplitude than a desired signal component and may be located close in frequency to the desired signal component. A mixer 138 frequency downconverts the conditioned RF signal with the Q LO signal and provides a baseband signal. A jammer detector 140 receives the baseband signal and detects for presence of jammers. In another embodiment, jammer detection is performed based on signals in the I and/or Q receive paths, e.g., the baseband signals from mixer 124a and/or 124b. In yet another embodiment, jammer detection is performed based on the data samples provided to digital processor 150. For example, a Fourier transform may be performed on the data samples, and jammers may be detected by examining spectral components from the Fourier transform. Jammer detection may also be performed in other manners.

A controller/processor 160 directs the operations of various processing units at wireless device 100. A memory 162 stores data and program codes for wireless device 100.

FIG. 1 shows a specific embodiment of receiver 110. In general, a receiver may perform signal conditioning using one or more stages of amplifier, filter, mixer, and so on, which may be arranged differently from the embodiment shown in FIG. 1. Furthermore, a receiver may employ other circuit blocks not shown in FIG. 1.

FIG. 2A shows an exemplary received RF signal at the input of LNA 120 in FIG. 1. The received RF signal includes a desired signal component 212 centered at a frequency of $f_0$ and two jammers 214a and 214b located at frequencies of $f_1$ and $f_2$, respectively. For cdma2000, the desired CDMA signal has a bandwidth of 1.23 MHz.

IS-98D specifies a two-tone test that is applicable to cdma2000 receivers. In this test, two tones are located at +/−900 KHz and +/−1700 KHz from the center frequency of the desired CDMA signal and are 58 dB higher in amplitude than the CDMA signal level. These two tones model strong interfering signals transmitted by a nearby base station in an Advanced Mobile Phone Service (AMPS) system. IS-98D specifies three test cases, which are given in Table 1.

TABLE 1

| | Desired Signal Level | Jammer Level |
|---|---|---|
| Case 1 | −101 dBm | −43 dBm |
| Case 2 | −90 dBm | −32 dBm |
| Case 3 | −79 dBm | −21 dBm |

An active device, such as LNA 120 or mixer 124, has the following transfer function:

$$y(x)=a_1 \cdot x+a_2 \cdot x^2+a_3 \cdot x^3+\text{higher order terms}, \quad \text{Eq (1)}$$

where
  x is an input signal for the active device,
  $a_1$, $a_2$ and $a_3$ are coefficients that define the linearity of the active device, and
  y(x) is an output signal from the active device.

For simplicity, higher order terms above third order may be ignored. For the two-tone test shown in FIG. 2A, the input signal may be expressed as:

$$x=r(t)+g_1 \cdot \cos(2\pi f_1 \cdot t)+g_2 \cdot \cos(2\pi f_2 \cdot t), \quad \text{Eq (2)}$$

where
  r(t) is the desired CDMA signal as a function of time t, and
  $g_1$ and $g_2$ are the amplitude of the jammers at $f_1$ and $f_2$, respectively.

For an ideal active device, coefficients $a_2$ and $a_3$ are equal to 0.0, and the output signal is simply equal to the input signal scaled by $a_1$. However, all active devices experience some amount of non-linearity, which is quantified by coefficients $a_2$ and $a_3$. Coefficient $a_2$ defines the amount of second order non-linearity, and coefficient $a_3$ defines the amount of third order non-linearity.

FIG. 2B shows the amplified RF signal at the output of LNA 120. Non-linearity in LNA 120 may cause (1) second-order intermodulation (IM2) components at frequencies such as $f_2-f_1$, $f_2+f_1$, $2f_1$ and $2f_2$ and (2) third-order intermodulation (IM3) components at frequencies such as $2f_1-f_2$ and $2f_2-f_1$. The IM2 components are caused by the $x^2$ term in equation (1) and may be mitigated by careful design methodology. The IM3 components are caused by the $X^3$ term in equation (1) and are more problematic. For the two-tone test, jammers at $f_1=+900$ KHz and $f_2=+1700$ KHz produce an IM3 component 216a at $2f_1-f_2=+100$ KHz and an IM3 component 216b at $2f_2-f_1=+2500$ KHz. The IM3 component at +2500 KHz may be filtered by lowpass filters 126a and 126b in FIG. 1. However, the IM3 component at +100 KHz falls inside the desired signal bandwidth and acts as additional noise that degrades the desired signal.

The amplitudes of the IM3 components are determined by coefficient $a_3$ as well as the amplitudes $g_1$ and $g_2$ of the jammers. A smaller $a_3$ may typically be obtained by biasing the active device with more current. The amplitudes of the IM3 components at $2f_1-f_2$ and $2f_2-f_1$ are scaled by $a_3$ as well as $g_1 \cdot g_2^2$ and $g_1^2 \cdot g_2$, respectively. Hence, a 1 dB increase in the jammer amplitude results in a 3 dB increase in the IM3 components.

Mixers 124a and 124b also have non-linearity and generate IM3 components. The amplitudes of the IM3 components from mixers 124a and 124b are dependent on the gain of preceding LNA 120. In particular, an X dB increase in the gain of LNA 120 results in an X dB increase in the desired signal and the jammers at the output of LNA 120. This X dB increase in the jammers results in a 3X dB increase in the IM3 components from mixers 124. Hence, when jammers are present, it is desirable to decrease the gain of LNA 120. For example, the same jammer level may be provided to mixers 124a and 124b for all three cases in Table 1 by decreasing the LNA gain by approximately 11 dB from case 1 to case 2, and by approximately another 11 dB from case 2 to case 3.

However, decreasing the gain of LNA 120 may degrade noise performance. An active device generates thermal noise that degrades signal quality. Since the amount of noise generated by the active device is approximately constant, signal quality degrades as the gain of the active device is lowered and the signal amplitude is decreased. The amount of noise degradation may be quantified by a noise figure (NF), which may be expressed as:

$$NF_d = SNR_{in} - SNR_{out}, \quad \text{Eq (3)}$$

where
  $SNR_{in}$ is the signal-to-noise ratio (SNR) of an input signal for the active device,
  $SNR_{out}$ is the SNR of an output signal from the active device, and
  $NF_d$ is the noise figure of the active device.
$SNR_{in}$, $SNR_{out}$ and $NF_d$ are given in units of dB.

If multiple active devices are coupled in cascade, then the noise figure from the first active device to the n-th active device may be expressed as:

$$NF_n = 10 \cdot \log_{10}\left(10^{NF_{n-1}/10} + \frac{10^{NF_{dn}/10} - 1}{10^{G_{n-1}/10}}\right), \quad \text{Eq (4)}$$

where
  $NF_{dn}$ is the noise figure of the n-th active device,
  $G_{n-1}$ is the accumulated gain of the first through (n−1)-th active devices,
  $NF_{n-1}$ is the cascaded noise figure of the first through (n−1)-th active devices, and
  $NF_n$ is the cascaded noise figure of the first through n-th active devices.

As shown in equation (4), the gain of an active device affects the cascaded noise figure of a subsequent active device. LNA 120 is coupled in cascade with mixers 124. Thus, the gain of LNA 120 affects the cascaded noise figure of mixers 124.

Figure 3A:
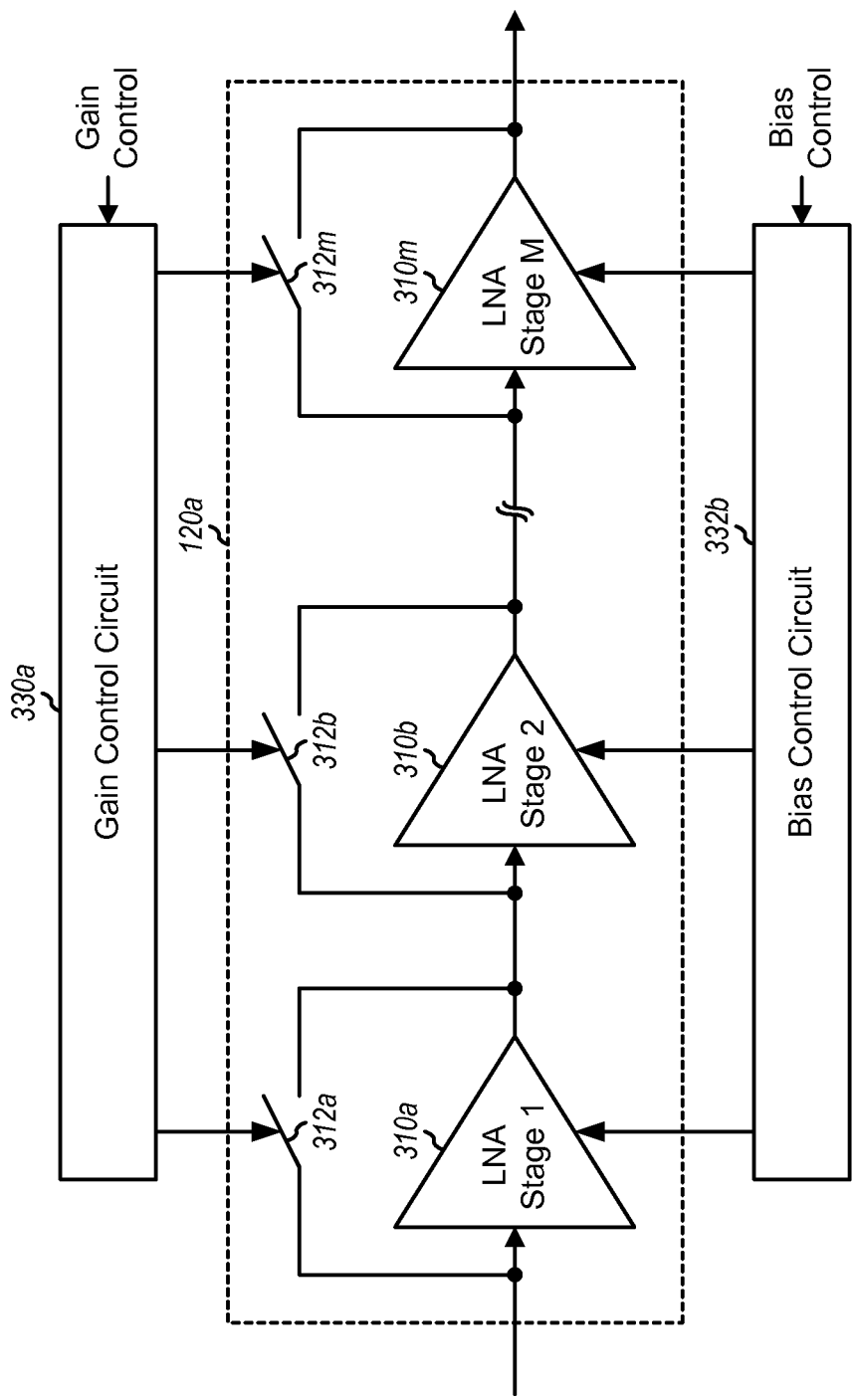
FIGS. 3A and 3B show two embodiments of an LNA with discrete gain states.

FIG. 3A shows a block diagram of an LNA 120a, which is one embodiment of LNA 120 in FIG. 1. In this embodiment, LNA 120a includes M LNA stages 310a through 310m that are coupled in cascade. The first LNA stage 310a receives the received RF signal, and the last LNA stage 310m provides the amplified RF signal. Each LNA stage 310 has a switch 312 coupled in parallel with the LNA stage. A gain control unit 330a generates controls for switches 312a through 312m. Each switch 312 may be closed or opened based on its control. A bias control unit 332a generates bias currents for LNA stages 310a through 310m. Gain control unit 330a and bias control unit 332a are an embodiment of LNA control unit 144 in FIG. 1.

Each LNA stage 310 provides a particular gain. The M LNA stages 310a through 310m may provide the same or different gains. In an embodiment, M different gain states are obtained for LNA 120a by enabling different combinations of LNA stages. For example, the lowest gain state $G_M$ may be obtained by enabling LNA stage 310a and bypassing remaining LNA stages 310b through 310m, the second lowest gain state $G_{M-1}$ may be obtained by enabling LNA stages 310a and 310b and bypassing remaining LNA stages, and so on, and the highest gain state $G_1$ may be obtained by enabling all M LNA stages 310a through 310m. An LNA stage may be enabled by providing bias current to that LNA stage and opening the switch coupled in parallel with the LNA stage. Conversely, an LNA stage may be bypassed by providing no bias current to the LNA stage and closing the switch coupled in parallel with the LNA stage. Discrete gain states may also be obtained by enabling and bypassing the LNA stages in other manners.

Figure 3B:
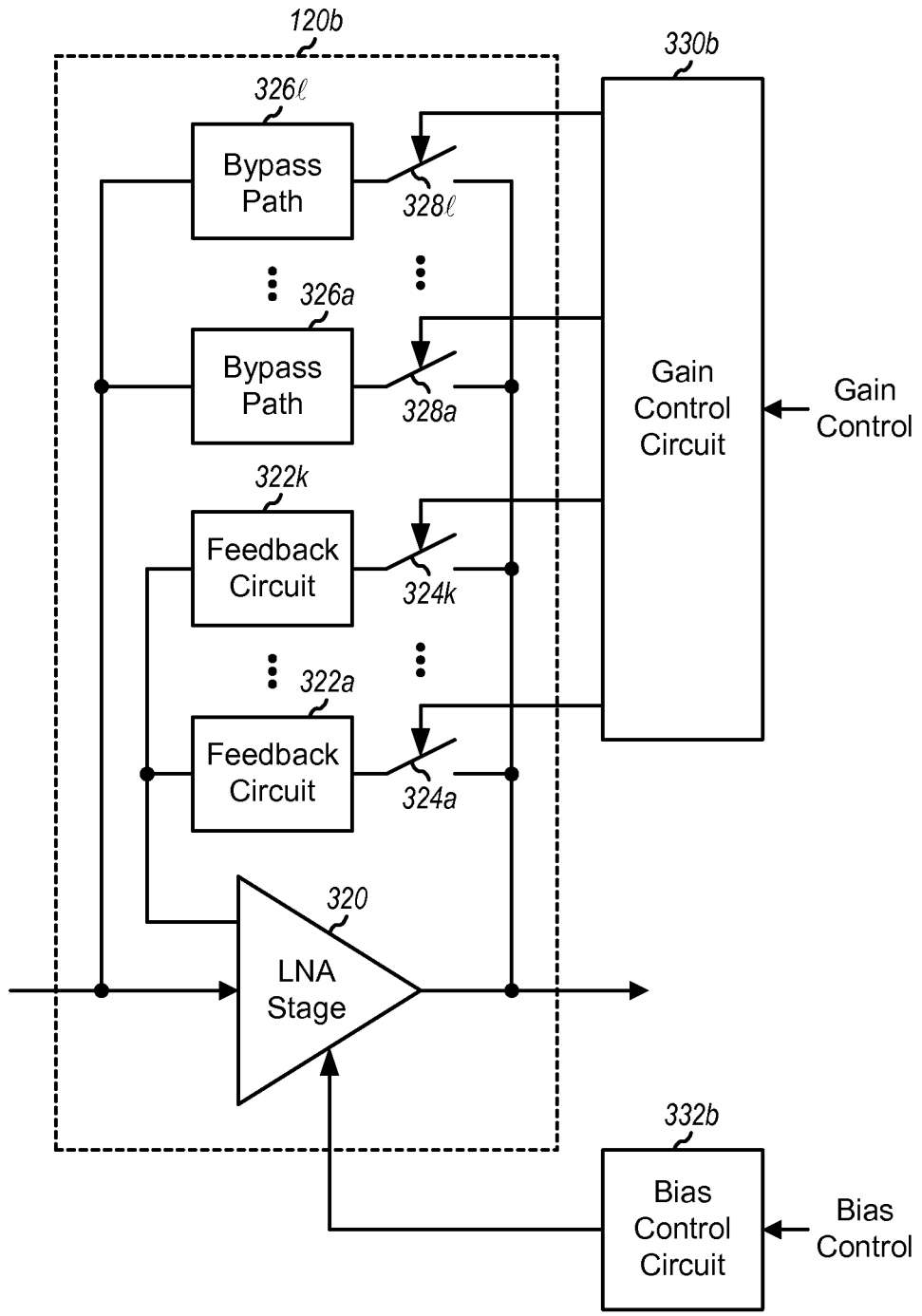

FIG. 3B shows a block diagram of an LNA 120b, which is another embodiment of LNA 120 in FIG. 1. In this embodiment, LNA 120b includes a single LNA stage 320, K feedback circuits 322a through 322k, and L bypass paths 326a through 326l, where in general K≧0 and L≧0. LNA stage 320 receives the received RF signal and provides the amplified RF signal. Each feedback circuit 322 couples in series with a switch 324, and the combination is coupled across LNA stage 320. Each bypass path 326 couples in series with a switch 328, and the combination is coupled in parallel with LNA stage 320. A gain control unit 330b generates controls for switches 324a through 324k and switches 328a through 328l. Each switch may be closed or opened based on its control. A bias control unit 332b generates bias current for LNA stage 320. Gain control unit 320b and bias control unit 332b are another embodiment of LNA control unit 144 in FIG. 1.

Each feedback circuit 322 provides a different gain for LNA stage 320. Each bypass path 326 provides a different amount of attenuation for the received RF signal. Different gain states may be obtained for LNA 120b by enabling different feedback circuits 322 or different bypass paths 326.

FIGS. 3A and 3B shows two exemplary LNA designs. The techniques described herein may also be used with other LNAs having discrete gain states.

In an embodiment, the LNA switch points are determined based on channel conditions. An LNA switch point is a point at which an LNA is switched from one gain state to another gain state. For an LNA with M gain states, there are M−1 switch points. Each switch point may be defined as a particular received signal level/strength, a particular received pilot power, a particular received signal quality, or some other quantity. The channel conditions may be characterized by the presence or absence of jammers, the magnitude of the jammers, the presence or absence of other interferers, and/or other factors. Different sets of LNA switch points may be defined for different channel conditions. One set of LNA switch points may be selected for use at any given moment based on the current channel conditions.

In an embodiment, a first set of LNA switch points is used when jammers are detected, and a second set of LNA switch points is used when jammers are not detected. The LNA switch points in the first set may be defined to be lower than the LNA switch points in the second set. This results in the LNA gain being generally lower, for cases 2 or 3 from table 1, when jammers are detected, which improves linearity and allows the wireless device to meet linearity requirements. This also results in the LNA gain being generally higher when jammers are not detected, which improves noise performance and allow the wireless device to achieve higher SNR. The higher SNR results in higher data throughput, lower packet error, and/or other benefits.

Table 2 shows an embodiment of dynamic LNA switch points based on the presence or absence of jammers. For clarity, the embodiment in Table 2 is for an LNA with five gain states $G_1$ through $G_5$, with $G_1$ being the highest gain state and $G_5$ being the lowest gain state. The embodiment in Table 2 utilizes hysteresis to avoid continually switching between gain states when the received signal level fluctuates near a switch point. When jammers are detected, the first set of switch points $S_{12j}$ through $S_{54j}$ is used to select the gain of the LNA. When jammers are not detected, the second set of switch points $S_{12n}$ through $S_{54n}$ is used to select the gain of the LNA. Switch point $S_{xyj}$ is used to switch from gain state $G_x$ to gain state $G_y$ when jammers are detected, where subscript "j" denoted jammers. Switch point $S_{xyn}$ is used to switch from gain state $G_x$ to gain state $G_y$ when jammers are not detected, where subscript "n" denoted no jammers.

TABLE 2

LNA switch points

| LNA Gain State | LNA switch points with jammers detected | | LNA switch points with no jammers detected | |
| --- | --- | --- | --- | --- |
| | Increasing signal level | Decreasing signal level | Increasing signal level | Decreasing signal level |
| $G_1$ | $S_{12j}$ | $S_{21j}$ | $S_{12n}$ | $S_{21n}$ |
| $G_2$ | $S_{23j}$ | $S_{32j}$ | $S_{23n}$ | $S_{32n}$ |
| $G_3$ | $S_{34j}$ | $S_{43j}$ | $S_{34n}$ | $S_{43n}$ |
| $G_4$ | $S_{45j}$ | $S_{54j}$ | $S_{45n}$ | $S_{54n}$ |
| $G_5$ | | | | |

In general, the switch points in each set may be determined based on computer simulation, lab testing, empirical measurements, and/or other means. In an embodiment, the first set of LNA switch points is defined to meet linearity requirements for the two-tone test in IS-98D and other applicable tests. The second set of LNA switch points may be defined to achieve improved SNR and data performance when jammers are not present.

Figure 4:
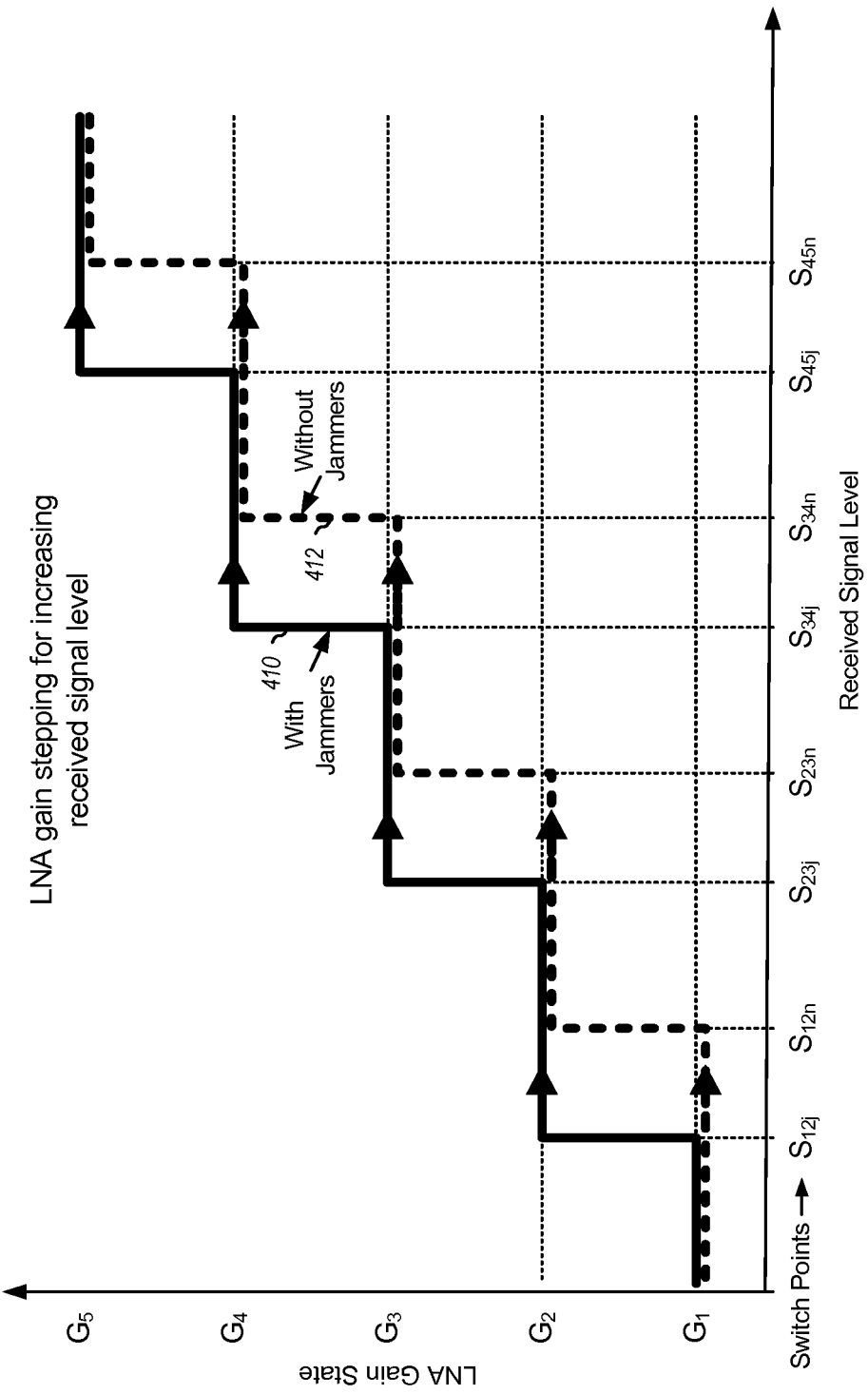
FIG. 4 shows LNA gain for different switch points with and without jammers.

FIG. 4 shows plots of LNA gain versus received signal level for two cases—with and without jammers. Plot 410 shows LNA gain for increasing received signal level when jammers are detected. Starting from the highest gain state $G_1$, the next lower gain state $G_2$ is selected if the received signal level exceeds switch point $S_{12j}$, then the next lower gain state $G_3$ is selected if the received signal level exceeds switch point $S_{23j}$, then the next lower gain state $G_4$ is selected if the received signal level exceeds switch point $S_{34j}$, and then the lowest gain state $G_5$ is selected if the received signal level exceeds switch point $S_{45j}$, where $S_{12j} < S_{23j} < S_{34j} < S_{45j}$.

The LNA gain for decreasing received signal level is not shown in FIG. 4 but is indicated in Table 2. When at the lowest gain state $G_5$, the next larger gain state $G_4$ is selected if the received signal level falls below $S_{54j}$, then the next larger gain state $G_3$ is selected if the received signal level falls below $S_{43j}$, then the next larger gain state $G_2$ is selected if the received signal level falls below $S_{32j}$, and then the largest gain state $G_1$ is selected if the received signal level falls below $S_{21j}$. The switch points may be defined such that $S_{12j} > S_{21j}$, $S_{23j} > S_{32j}$, $S_{34j} > S_{43j}$, and $S_{45j} > S_{54j}$ (these changes must be made to agree with paragraph 0059) to obtain hysteresis. For example, if $S_{12j}$ is higher than $S_{21j}$, then after switching to gain state $G_2$ when the received signal level exceeds $S_{12j}$, the received signal level would need to past $S_{12j}$ and fall below the lower $S_{21j}$ in order to activate a switch back to gain state $G_1$. The difference between $S_{12j}$ and $S_{21j}$ is the amount of hysteresis.

Plot 412 shows LNA gain for increasing received signal level when jammers are not detected. In general, the gain selection may be performed in the same manner for both cases with and without jammers. However, the switch point $S_{xyn}$ for transitioning from gain state $G_x$ to gain state $G_y$ for the case without jammers is higher than the corresponding switch point $S_{xyj}$ for the case with jammers, or (change to greater than) $S_{xyn} > S_{xyj}$. This allows a higher gain state to be selected with a lower received signal level when jammers are not detected.

In another embodiment, more than two sets of LNA switch points are defined for different jammer levels. For example, a first set may be defined for no jammers, a second set may be defined for medium jammers, and a third set may be defined for large jammers. In general, any number of sets may be defined. One set of LNA switch points may be selected for use from among the available sets based on the detected jammer amplitude.

Figure 5:
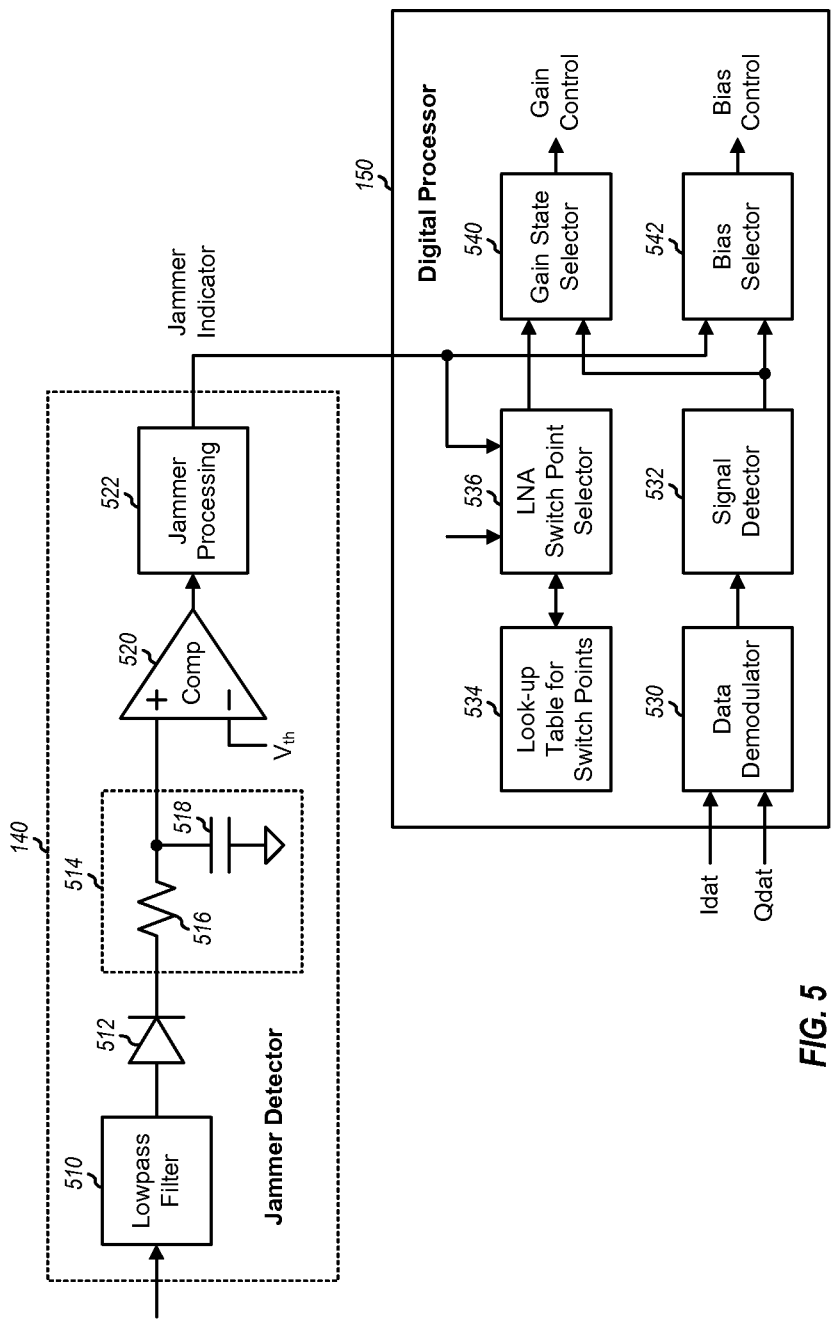
FIG. 5 shows a block diagram of a jammer detector and a digital processor.

FIG. 5 shows a block diagram of an embodiment of jammer detector 140 and digital processor 150 in FIG. 1. Within jammer detector 140, a lowpass filter 510 receives and filters the baseband signal from mixer 138 with a lowpass filter response. Filter 510 may be a programmable pre-selector filter having a bandwidth determined by the band class (e.g., cellular or PCS) being received. Filter 510 may be used to attenuate leakage signals from a transmitter co-located with receiver 110 at wireless device 100. Filter 510 may also be omitted.

A diode (don't have to use a diode, does this make it too specific?) 512 rectifies the signal from lowpass filter 510 and converts this signal from a sinusoidal signal (with positive and negative amplitude) to a single-ended signal (with only positive amplitude). A lowpass filter 514 formed with a resistor 516 and a capacitor 518 filters the rectified signal and provides a filtered signal. Filter 514 has a bandwidth selected to reduce the variance of the jammer detector output as desired. A comparator (Comp) 520 compares the filtered signal against a jammer threshold, $V_{th}$, and provides a jammer indicator signal. The jammer threshold, $V_{th}$, may be programmed by the digital processor 150 to different levels based on the current gain state of the receiver, or channel conditions, or received signal strength. The jammer indicator signal may be (1) logic high '1' if the filtered signal amplitude is larger than the jammer threshold, indicating the presence of jammers in the received signal, or (2) logic low '0' otherwise. A jammer processing unit 522 processes the jammer interrupt signal and provides a jammer indicator that indicates whether or not jammers are detected. Unit 522 may filter the jammer signal to reduce chatter/toggling of the jammer indicator. Unit 522 may perform filtering with various types of filter, with counters, and so on. Unit 522 may also apply hysteresis in the detection of jammers. The jammer indicator may be a status signal, an interrupt, or some other type of signal. Information regarding the jammers may be sent in the jammer indicator and/or stored in unit 522. For example, if the jammer indicator is an interrupt, then digital processor 150 may retrieve pertinent information from unit 522 upon receiving the interrupt.

In the embodiment shown in FIG. 5, a single jammer detector 140 is used to detect for jammers. In another embodiment, one jammer detector is used to detect for close-in jammers, and another jammer detector is used to detect for far-out jammers. A close-in jammer is a jammer that is close in frequency to the desired signal. A far-out jammer is a jammer that is further out in frequency from the desired signal. The jammer indicators from all jammer detectors may be used to select the switch points, gain, and/or bias of the LNA.

Within digital processor 150, a data demodulator 530 receives and demodulates the I and Q data samples from ADCs 130 in accordance with the system being received. A signal detector 532 determines the received signal level based on an output (e.g., pilot symbols) from demodulator 530.

An LNA switch point selector 536 receives the jammer indicator from jammer detector 140 and determines the LNA switch points to use based on the jammer indicator and possibly other information. A look-up table 534 stores different sets of LNA switch points for different channel conditions, e.g., one set of LNA switch points for the case when jammers are detected, and another set of LNA switch points for the case when jammers are not detected, e.g., as shown in Table 2. Selector 536 may retrieve the proper set of LNA switch points from look-up table 534 based on whether or not jammers are detected. A gain state selector 540 receives the LNA switch points from selector 536 and the received signal level from signal detector 532. Selector 540 compares the received signal level against the LNA switch points and selects a gain state for LNA 120 based on the comparison results. One set of LNA switch points may thus be selected based on the presence or absence of jammers, and a gain state may be selected based on this set of LNA switch points and the received signal level.

A bias selector 542 receives the jammer indicator and/or the received signal level and generates a bias control for LNA 120. In an embodiment, the bias control is generated based solely on the jammer indicator. In another embodiment, the bias control is generated based on the jammer indicator and the received signal level. In any case, the bias control determines the amount of bias current to use for LNA 120. For example, more bias current may be used when jammers are detected, and less bias current may be used when jammers are not detected. (add a period)

In an embodiment, the gain state and bias of LNA 120 are determined and applied at the same time. In another embodiment, the gain state and bias are independently determined and applied whenever pertinent information is available.

Figure 6:
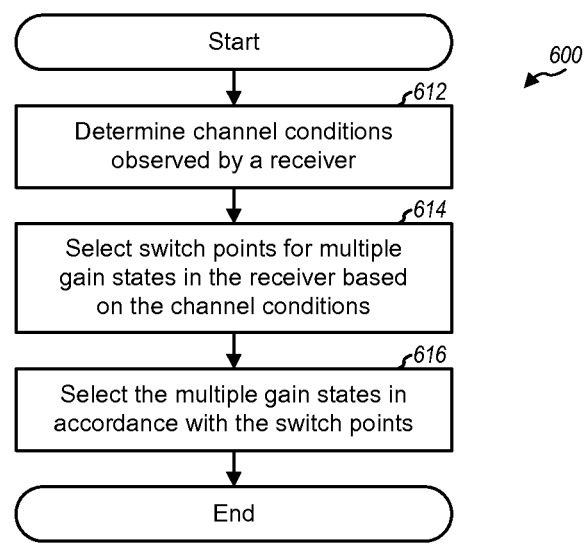
FIG. 6 shows a process for operating the receiver.

FIG. 6 shows an embodiment of a process 600 for operating a receiver in a wireless device. Channel conditions observed by the receiver are determined (block 612). Switch points for multiple gain states of the receiver are selected based on the channel conditions (block 614). Each switch point is associated with two gain states and indicates a specific received signal level at which to switch from one gain state to another gain state. Multiple sets of switch points may be stored for different channel conditions, and one set of switch points may be selected based on the channel conditions. The multiple gain states are then selected in accordance with the switch points (block 616). For block 616, the received signal level of a received signal may be compared against the switch points, and one of the multiple gain states may be selected based on the comparison results. The multiple gain states may be for an LNA and/or other circuit blocks in the receiver. Bias current of the LNA and/or other circuit block may also be determined based on the channel conditions and/or the received signal level.

In an embodiment, the channel conditions are characterized by the presence or absence of jammers. A first set of switch points may be selected when jammers are detected, and a second set of switch points may be selected when jammers are not detected. The switch points in the first set may be defined to meet linearity requirements when jammers are present. The switch points in the second set may be defined to achieve higher signal-to-noise ratio than the switch points in the first set when jammers are not present. The switch points in the first set are lower than the corresponding switch points in the second set.

The selected set of switch points may include a first subset of switch points for decreasing received signal level and a second subset of switch points for increasing received signal level. The switch points in the first subset may be lower than the corresponding switch points in the second subset to provide hysteresis.

The techniques described herein may be used to dynamically select switch points for an LNA, as described above. The techniques may also be used to dynamically select switch points for other circuit blocks with discrete gain states, e.g., mixers, variable gain amplifiers (VGAs), and so on.

The techniques described herein may be used for receivers in various wireless communication systems such as CDMA systems, Time Division Multiple Access (TDMA) systems, Frequency Division Multiple Access (FDMA) systems, Orthogonal FDMA (OFDMA) systems, Single-Carrier FDMA (SC-FDMA) systems, and other systems. A CDMA system may implement one or more radio technologies such as cdma2000, Wideband-CDMA (W-CDMA), and so on. cdma2000 covers IS-95, IS-2000, and IS-866 standards. A TDMA system may implement a radio technology such as Global System for Mobile Communications (GSM). These radio technologies and systems are known in the art.

The techniques described herein may be implemented by various means. For example, the techniques may be implemented in hardware, firmware, software, or a combination thereof. For a hardware implementation, the processing units used to dynamically select switch points may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the techniques may be implemented with modules (e.g., procedures, functions, and so on) that perform the functions described herein. The firmware and/or software codes may be stored in a memory (e.g., memory 162 in FIG. 1) and executed by a processor (e.g., processor 160). The memory may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising
  at least one processor configured to:
    determine channel conditions observed by a receiver;
    select a set of switch points from multiple sets of switch points including a first set of switch points to be used in the presence of jammers having a first amplitude, a second set of switch points to be used in the presence of jammers having a second amplitude and a third set of switch points to be used in the absence of jammers;
    select from the set of switch points for multiple gain states of a variable gain amplifier of the receiver based on the channel conditions, wherein at least one set of switch points is for decreasing a gain of the amplifier in the presence and upon detection of jammers;
    select a bias current to be conveyed to the amplifier based on the channel conditions, the processor further configured to select a first bias current upon detection of jammers and a second, lower bias current in the absence of jammers; and select the multiple gain states in accordance with the switch points.

2. The apparatus of claim 1, further comprising:
a memory configured to store the multiple sets of switch points for different channel conditions.

3. The apparatus of claim 1, wherein the multiple gain states are for a low noise amplifier (LNA) in the receiver.

4. The apparatus of claim 1, wherein the channel conditions are characterized by presence or absence of jammers.

5. The apparatus of claim 4, further comprising:
a jammer detector configured to detect for jammers in a received signal.

6. The apparatus of claim 5, wherein the jammer detector is configured to generate an interrupt for the at least one processor when jammers are detected.

7. The apparatus of claim 4, wherein the at least one processor is configured to select either the first or the second set of switch points when jammers are detected and to select the third set of switch points when jammers are not detected.

8. The apparatus of claim 7, wherein the switch points in each of the first set and second set are lower than corresponding switch points in the third set.

9. The apparatus of claim 7, wherein the switch points in each of the first set and second set are defined to meet linearity requirements for the receiver when jammers are present.

10. The apparatus of claim 7, wherein the switch points in the third set are defined to achieve higher received signal quality than the switch points in each of the first set and second set when jammers are not present.

11. The apparatus of claim 1, wherein the switch points comprise a first subset of switch points for decreasing received signal level and a second subset of switch points for increasing received signal level, and wherein the switch points in the first subset are lower than corresponding switch points in the second subset.

12. The apparatus of claim 1, wherein each switch point is associated with two gain states and indicates a specific received signal level at which to switch from one of the two gain states to the other one of the two gain states.

13. The apparatus of claim 1, wherein the at least one processor is configured to determine received signal level of a received signal, to compare the received signal level against the switch points, and to select one of the multiple gain states based on results of the comparison.

14. The apparatus of claim 4, wherein the at least one processor is configured to determine bias current of a low noise amplifier (LNA) in the receiver based on presence or absence of jammers.

15. A method comprising:
determining channel conditions observed by a receiver;
selecting a set of switch points from multiple sets of switch points including a first set of switch points to be used in the presence of jammers having a first amplitude, a second set of switch points to be used in the presence of jammers having a second amplitude and a third set of switch points to be used in the absence of jammers
selecting from the set of switch points for multiple gain states of a variable gain amplifier of the receiver based on the channel conditions, wherein at least one set of switch points is for decreasing a gain of the amplifier in the presence and upon detection of jammers;
selecting a bias current to be conveyed to the amplifier based on the channel conditions including selecting a first bias current upon detection of jammers and a second, lower bias current in the absence of jammers; and
selecting the multiple gain states in accordance with the switch points.

16. The method of claim 15, further comprising:
storing the multiple sets of switch points for different channel conditions; and
providing one of the multiple sets of switch points based on the channel conditions.

17. The method of claim 15, wherein the selecting the switch points comprises
selecting either the first set or second set of switch points when jammers are detected, and
selecting the third set of switch points when jammers are not detected.

18. The method of claim 15, wherein the selecting the multiple gain states comprises
determining received signal level of a received signal,
comparing the received signal level against the switch points, and
selecting one of the multiple gain states based on results of the comparison.

19. An apparatus comprising:
a processor for determining channel conditions observed by a receiver;
means for selecting a set of switch points from multiple sets of switch points including a first set of switch points to be used in the presence of jammers having a first amplitude, a second set of switch points to be used in the presence of jammers having a second amplitude and a third set of switch points to be used in the absence of jammers;
means for selecting from the set of switch points for multiple gain states of a variable gain amplifier of the receiver based on the channel conditions, wherein at least one set of switch points is for decreasing a gain of the amplifier in the presence and upon detection of jammers;
means for selecting a bias current to be conveyed to the amplifier based on the channel conditions including selecting a first bias current upon detection of jammers and a second, lower bias current in the absence of jammers; and
means for selecting the multiple gain states in accordance with the switch points.

20. The apparatus of claim 19, further comprising:
means for storing the multiple sets of switch points for different channel conditions; and
means for providing one of the multiple sets of switch points based on the channel conditions.

21. The apparatus of claim 19, wherein the means for selecting the switch points comprises
means for selecting either the first set or second set of switch points when jammers are detected, and
means for selecting the third set of switch points when jammers are not detected.

22. The apparatus of claim 19, wherein the means for selecting the multiple gain states comprises
means for determining received signal level of a received signal,
means for comparing the received signal level against the switch points, and
means for selecting one of the multiple gain states based on results of the comparison.

23. A processor readable memory including instructions stored thereon operable to cause the processor to:
determine channel conditions observed by a receiver;
select a set of switch points from multiple sets of switch points including a first set of switch points to be used in the presence of jammers having a first amplitude, a second set of switch points to be used in the presence of jammers having a second amplitude and a third set of switch points to be used in the absence of jammers;

select from the set of switch points for multiple gain states of a variable gain amplifier of the receiver based on the channel conditions, wherein at least one set of switch points is for decreasing a gain of the amplifier in the presence and upon detection of jammers;

select a bias current to be conveyed to the amplifier based on the channel conditions, the instruction further operable to cause the processor to select a first bias current upon detection of jammers and a second, lower bias current in the absence of jammers; and select the multiple gain states in accordance with the switch points.

24. The processor readable memory of claim 23, and further including instructions stored thereon operable to cause the processor to:

select either the first set or second set of switch points when jammers are detected, and select the third set of switch points when jammers are not detected.

25. A receiver in a wireless device, comprising:

a jammer detector configured to detect for jammers in a received signal;

a variable gain low noise amplifier (LNA) having multiple gain states selected based on switch points selected from a set of switch points from multiple sets of switch points including a first set of switch points to be used in the presence of jammers having a first amplitude, a second set of switch points to be used in the presence of jammers having a second amplitude and a third set of switch points to be used in the absence of jammers wherein at least one set of switch points is for decreasing a gain of the amplifier in the presence and upon detection of jammers; and a bias selector configured to select a bias current to be conveyed to the amplifier based on the channel conditions, the bias selector further configured to select a first bias current upon detection of jammers and a second, lower bias current in the absence of jammers.

26. The receiver of claim 25, wherein one of the first set and second set of switch points is used for the receiver when jammers are detected and the third set of switch points is used for the receiver when jammers are not detected.

27. The receiver of claim 25, wherein the LNA comprises multiple stages configurable to provide the multiple gain states.

28. The receiver of claim 25, wherein the LNA comprises a single LNA stage and multiple circuit paths configurable to provide the multiple gain states, wherein each circuit path changes gain of the LNA stage or provides a bypass path for the LNA stage.

29. The receiver of claim 25, wherein the jammer detector is configured to compare a baseband signal level against a threshold and to filter results of the comparison to detect for jammers in the received signal.

* * * * *